United States Patent
Gitsevich et al.

(10) Patent No.: US 6,552,620 B2
(45) Date of Patent: Apr. 22, 2003

(54) POWER OSCILLATOR

(75) Inventors: Aleksandr Gitsevich, Montgomery Village, MD (US); Douglas A. Kirkpatrick, Great Falls, VA (US); Donald A. MacLennan, Gaithersburg, MD (US)

(73) Assignee: Fusion Lighting, Inc., Rockville, MD (US)

( * ) Notice: Subject to any disclaimer, the term of this patent is extended or adjusted under 35 U.S.C. 154(b) by 0 days.

(21) Appl. No.: 09/949,770

(22) Filed: Sep. 12, 2001

(65) Prior Publication Data
US 2002/0050865 A1 May 2, 2002

Related U.S. Application Data
(60) Provisional application No. 60/231,942, filed on Sep. 12, 2000.

(51) Int. Cl.$^7$ ............... H03B 5/18; H01P 1/185
(52) U.S. Cl. ............. 331/99; 331/177 V; 331/107 DP; 331/117 FE
(58) Field of Search .................. 331/107 SL, 107 DP, 331/36 C, 177 V, 117 FE

(56) References Cited

U.S. PATENT DOCUMENTS

| | | | |
|---|---|---|---|
| 4,631,500 A | * | 12/1986 | Rauscher .................. 327/118 |
| 5,302,918 A | * | 4/1994 | Sturzebecher et al. ........ 331/10 |
| 5,973,575 A | * | 10/1999 | Kamogawa et al. .... 331/117 D |

FOREIGN PATENT DOCUMENTS

| WO | 99/36940 | 7/1999 |
|---|---|---|
| WO | 01/03161 | 1/2001 |
| WO | 02/23692 | 3/2002 |
| WO | 02/23711 | 3/2002 |

OTHER PUBLICATIONS

Prigent M. et al.: "High Efficiency Free Running Class F Oscillator" IEEE MIT–S International Microwave Symposium Digest, May 16, 1995, pp. 1317–1320.
Raab F.H.: "An Introduction to Class F Power Amplifiers", RF Design, Cardiff Publishing Co., vol. 19, No. 5, May 1, 1996, pp. 79–84.
Raab F.H.: "FET Power Amplifier with Maximally Flat Waveform" IEEE Trans., MTT. vol. 45, No. 11, Nov. 1997, pp. 2007–2011.
Cripps S.C.: "RF Power Amplifiers for Wireless Communications" Norwood, MA: Artech, 1999, ISBN 0–89006–989–1, pp. 125–140.

* cited by examiner

Primary Examiner—Terry D. Cunningham
Assistant Examiner—Quan Tra
(74) Attorney, Agent, or Firm—Paul E. Steiner

(57) ABSTRACT

An oscillator includes a solid state active device having an input and an output, a feedback circuit connected from the output of the active device to the input of the active device, the feedback circuit providing suitable positive feedback to initiate and sustain an oscillating condition at a fundamental frequency, and a waveform modifying circuit connected to the output of the active device, wherein the waveform modifying circuit is adapted to modify the waveform on the output in a manner which increases an efficiency of the oscillator. For example, the waveform modifying circuit comprises transmission lines and optionally components which provide a high impedance for odd harmonics of the fundamental frequency. The waveform modifying circuit may further include transmission lines and optionally components which provide a low impedance for even harmonics of the fundamental frequency. The waveform modifying circuit utilize class F amplifier principles to cause the waveform on the output to be relatively more square in shape.

4 Claims, 13 Drawing Sheets

POWER OSCILLATOR

Certain inventions described herein were made with Government support under Contract No. NAS10-99037 awarded by National Aeronautics and Space Administration. The Government has certain rights in those inventions.

BACKGROUND

1. Field of the Invention

The invention relates generally to oscillator circuits and more specifically to a high power, high efficiency oscillator circuit.

2. Related Art

Class F amplifiers are well known in the art and are described in various articles and books including *"FET Power Amplifier with Maximally Flat Waveform,"*, by F. H. Raab, IEEE Trans., MTT, Vol. 45, No. 11, Nov. 1997, pp. 2007–2011, and

*RF Power Amplifiers for Wireless Communications*, by S. C. Cripps, S. C., Norwood, M A: Artech, 1999, ISBN 0-89006-989-1. The state of the art for such amplifiers is believed to be about 50 watts and 65% efficient at somewhat less than 300 MHz frequency of operation.

The inventors are unaware of any reference which describes a power oscillator which utilizes class F amplifier principles. Class F amplifiers typically operate at a frequency range of less than 300 MHz and use lumped multiple-resonator output filters to control the harmonic content of their drain-voltage and/or drain-current waveforms. With an unstable load, these conventional Class F tank circuits develop high voltages which would be potentially destructive if fed back to the input (e.g. gate) of a solid state active device. Accordingly, the well known Class F drain circuits are not well suited for an oscillator configuration, particularly at high power and dynamically varying load conditions, such as those presented by an electrodeless lamp.

SUMMARY

The following and other objects, aspects, advantages, and/or features of the invention described herein are achieved individually and in combination. The invention should not be construed as requiring two or more of such features unless expressly recited in a particular claim.

In general, the present invention relates to the type of power oscillators described in PCT Publication Nos. WO 99/36940 and WO 01/03161, each of which is herein incorporated by reference in its entirety. The power oscillators described in these references are believed to define the state of the art in terms of power output, frequency range, and efficiency.

According to one aspect of the invention, an oscillator includes a solid state active device having an input and an output; and a feedback circuit connected from the output of the active device to the input of the active device, the feedback circuit providing suitable positive feedback to initiate and sustain an oscillating condition at a fundamental frequency; characterized in that the oscillator further includes a waveform modifying circuit connected to the output of the active device, wherein the waveform modifying circuit is adapted to modify the waveform on the output in a manner which increases an efficiency of the oscillator. For example, the waveform modifying circuit comprises transmission lines and optionally components which provide a high impedance for odd harmonics of the fundamental frequency. The waveform modifying circuit may further include transmission lines and optionally components which provide a low impedance for even harmonics of the fundamental frequency.

According to another aspect of the invention, an oscillator includes a solid state active device having an input and an output; and a feedback circuit connected from the output of the active device to the input of the active device, the feedback circuit providing suitable positive feedback to initiate and sustain an oscillating condition at a fundamental frequency; characterized in that the oscillator further includes a transmission line coupled to the output of the active device, the transmission line having an effective electrical length of one twelfth of a wavelength of the fundamental frequency. The oscillator may further include another transmission line connected to the output of the active device and having an effective electrical length of one eighth of the wavelength of the fundamental frequency.

According to another aspect of the invention, a high power solid state power RF oscillator includes a power FET having a gate, a drain, and a source, wherein the source is RF grounded and suitable voltages are respectively applied to the drain and gate to place the transistor in a conducting condition; a drain circuit connected to the drain of the power FET; and a feedback circuit connected between the drain circuit and the gate, wherein the feedback circuit is adapted to provide suitable positive feedback to initiate and sustain an oscillating condition with a fundamental frequency being greater than 300 MHz and with an RF power output in excess of 50 watts; characterized in that the drain circuit comprises transmission lines having widths which provide a conjugate match for the drain at a fundamental frequency and lengths which provide a high impedance for odd harmonics of the fundamental frequency. The drain circuit may further include a transmission line having a length which provides a low impedance for even harmonics of the fundamental frequency. For example, the drain circuit comprises a first transmission line connected at a first end to the drain and at a second end to an output matching circuit, and a second transmission line which is an open stub connected to the second end of the first transmission line, wherein the first transmission line and second transmission lines each have a width which provides a conjugate match for the drain at a fundamental frequency and an effective electrical length of about one twelfth of a wavelength of the fundamental frequency. The drain circuit may further include a third transmission line connected at one end to the drain and having an effective electrical length of one eighth of the wavelength of the fundamental frequency.

BRIEF DESCRIPTION OF THE DRAWINGS

The foregoing and other objects, features, and advantages of the invention will be apparent from the following more particular description of preferred embodiments as illustrated in the accompanying drawings, in which reference characters generally refer to the same parts throughout the various views. The drawings are not necessarily to scale, the emphasis instead being placed upon illustrating the principles of the invention.

DESCRIPTION

In the following description, for purposes of explanation and not limitation, specific details are set forth such as particular structures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
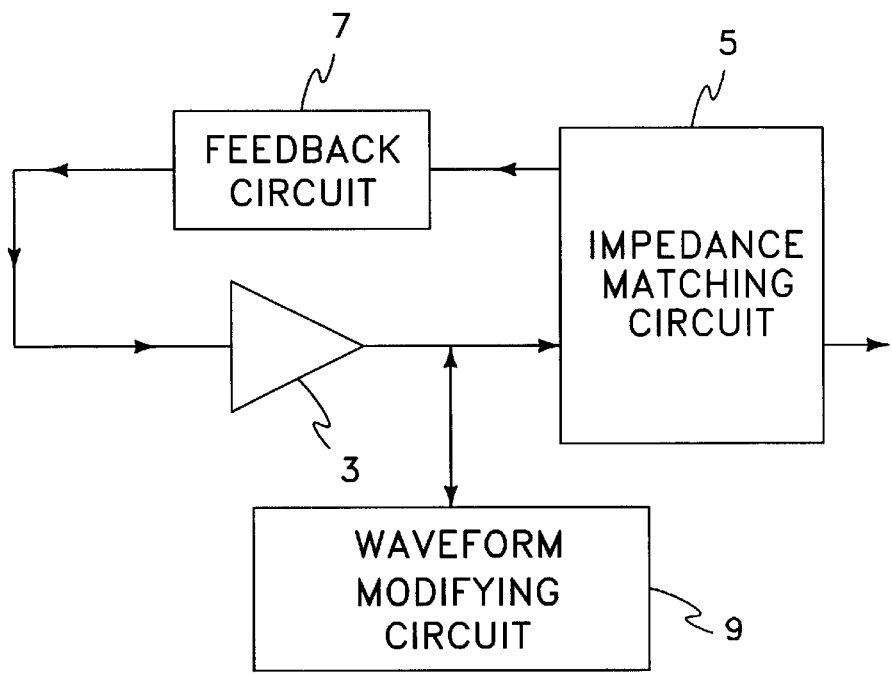
FIG. 1 is a first block diagram of an oscillator according to the present invention.

With reference to FIG. 1, an oscillator includes an active device 3 (e.g. a solid state transistor) with an input and an output. The output of the active device 3 is connected to an impedance matching circuit 5. A signal on the output of the active device 3 is fed back to the input of the active device 3 by a feedback circuit 7. Preferably, as shown in FIG. 1, the feedback signal is taken from the impedance matching circuit 5. The feedback circuit 7 provides suitable positive feedback to initiate and sustain an oscillating condition. Preferably, the feedback circuit 7 is further configured to protect the active device 3 from destructive feedback, as is described in detail in the aforementioned '940 publication. In accordance with the present invention, the oscillator further includes a waveform modifying circuit 9 connected to the output of the active device 3 which is adapted to modify the waveform on the output of the active device 3 to improve an efficiency of the oscillator.

Figure 2:
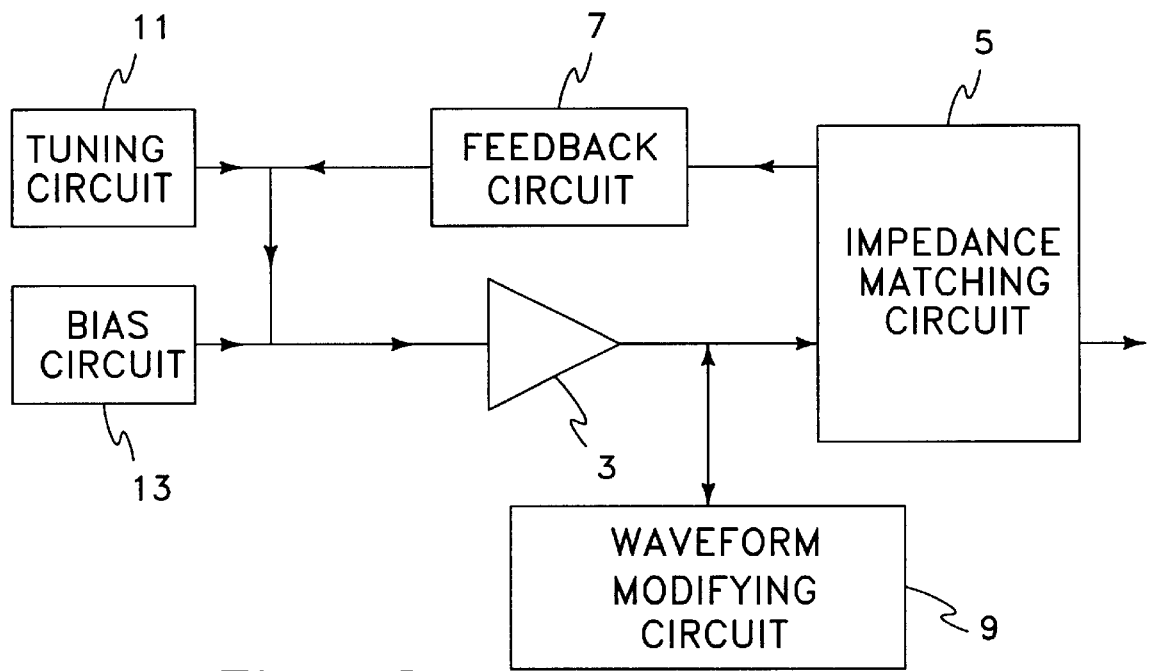
FIG. 2 is a second block diagram of an oscillator according to the present invention.

With reference to FIG. 2, an oscillator is similarly configured as described above in connection with FIG. 1, and further includes a tuning circuit 11 for adjusting an operating frequency of the oscillator and a bias circuit 13 for providing suitable bias and operating voltages to the oscillator.

With respect to the power oscillators described in the '940 and '161 publications, the circuit connected to the output of the active device is adapted primarily for matching and feedback, and no waveform shaping takes place at the output.

For a power MOSFET transistor in an amplifier configuration, efficiency may be improved by impressing a square wave on the gate and/or the drain. A square waveform reduces the amount of power dissipation in the transistor, thereby increasing efficiency.

Although various of the principles of class F amplifier operation are well known, it is a relatively complex task to combine those principles with other circuit requirements necessary to achieve a high power, high frequency, high efficiency oscillator. For example, those other requirements include providing a conjugate match for the drain output for power transfer at a given frequency, transformation of the impedance at the drain to match a nominal load impedance, and providing a suitable feedback signal. The inventors are unaware of any reference or references, alone or in combination, which provide sufficient guidance for constructing a high power, high efficiency oscillator which utilizes class F amplifier principles to increase efficiency while satisfying all of the other circuit requirements necessary to drive a complex load such as an electrodeless lamp.

In accordance with one aspect of the present invention, a relatively more square waveform is provided to the drain of a transistor in an oscillator configuration using only microstrip transmission lines, stubs, and/or non-inductive discrete components to 1) provide high impedance for odd harmonics to reflect the odd harmonics back to the drain; and, optionally if needed, 2) provide low impedance for even harmonics to suppress reflection of the even harmonics back to the drain. The reflected odd harmonics are combined with the fundamental frequency at the drain to provide a waveform with a more square shape as compared to the sinusoidal waveform of fundamental frequency alone.

FIRST EXAMPLE

Figure 3:
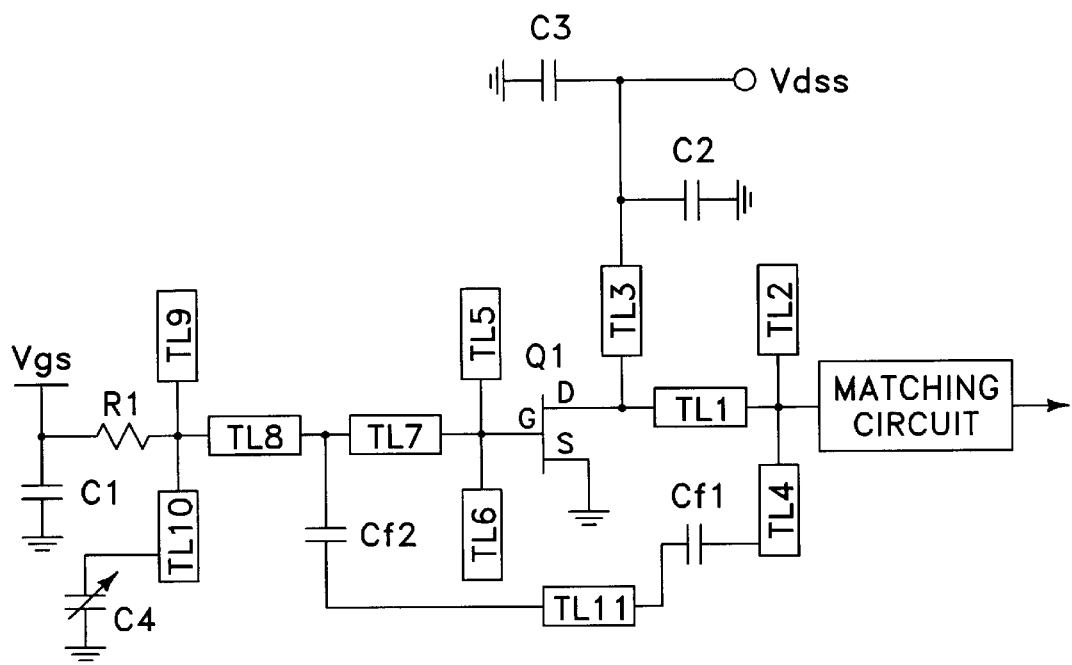
FIG. 3 is a schematic diagram of a first example of an oscillator according to the present invention.
Figure 4:
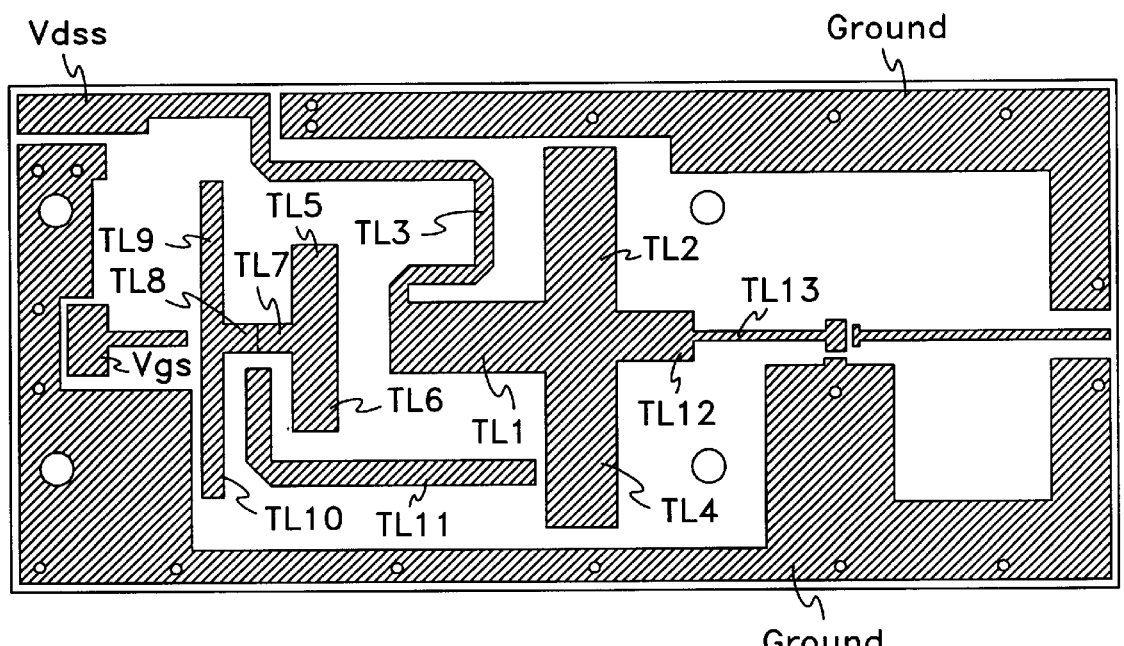
FIG. 4 is a printed circuit board diagram for the first example.
Figure 5:
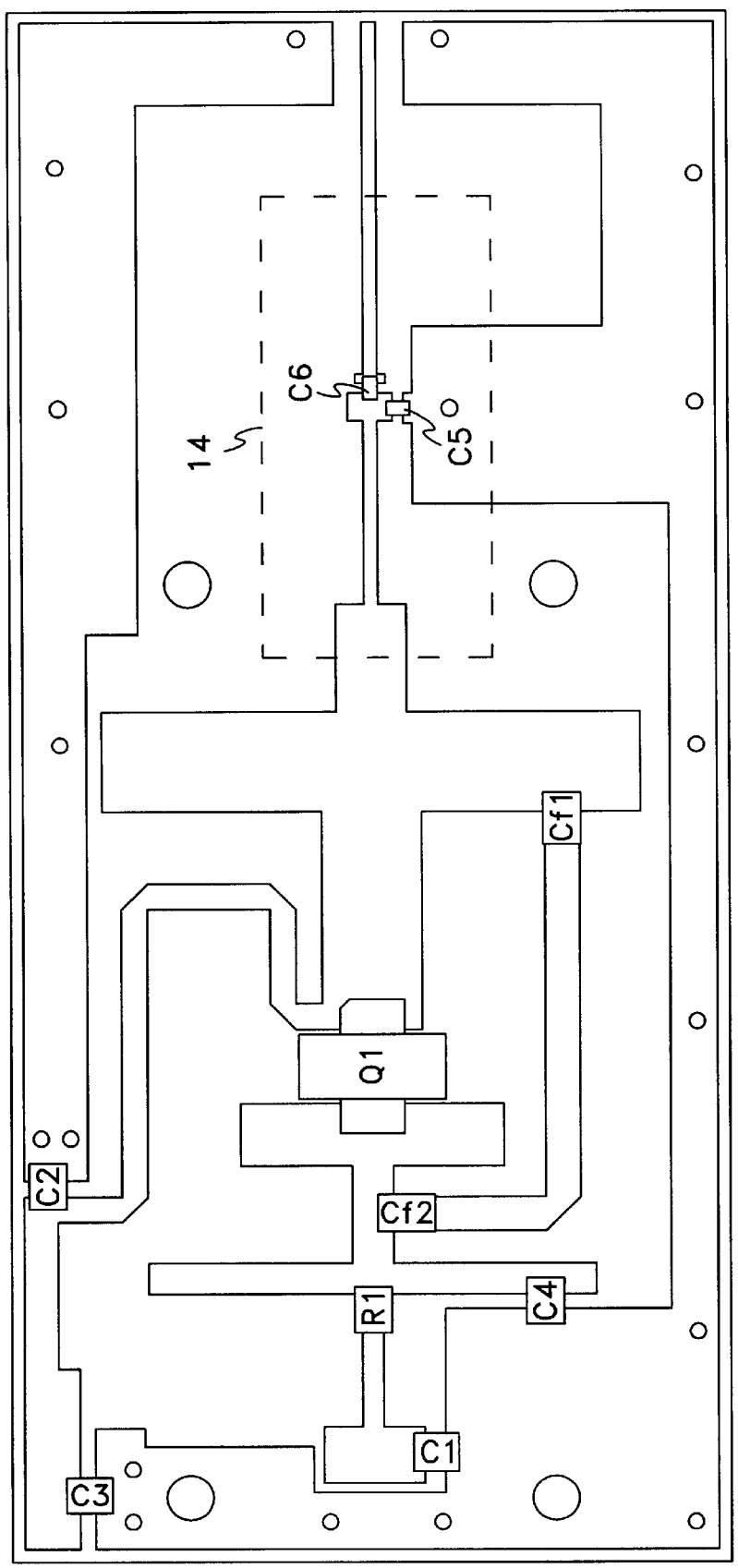
FIG. 5 is an assembly level drawing for the first example.

With reference to FIGS. 3–5, an oscillator circuit includes an active device Q1, such as a power LDMOS transistor. A source S of the transistor Q1 is grounded and a gate G of the transistor provides an input terminal and a drain D of the transistor provides an output terminal. A suitable DC voltage Vdss is applied to the drain D through a transmission line TL3. A suitable DC voltage Vgs is applied to the gate G through a resistor R1 and transmission lines TL7 and TL8. The drain D is connected to a drain circuit which includes a transmission line TL1 connected at one end to the drain D and connected at the other end to a junction of two transmission lines TL2 and TL4. The transmission line TL2 is open (unconnected) on its other end. The transmission line TL3 is connected on one end to the drain D and is connected to ground through a capacitor C2 on the other end. The transmission line TL3 is also used as a DC line to provide the DC voltage Vdss to the drain D.

The transmission line TL4 has an open circuit at one end and is connected at a selected point along its length to a feedback circuit which includes a first feedback capacitor Cf1, a transmission line TL11, and a second feedback capacitor Cf2 connected in series. The capacitor Cf2 is connected to the junction of the transmission lines TL7 and TL8. Two matching stubs TL5 and TL6 are connected at respective ends to the junction of TL7 and the gate G. Two open end tuning stubs TL9 and TL10 are each connected at one end to the junction of the transmission line TL8 and the resistor R1. A variable tuning capacitor C4 is connected between the transmission line TL10 and ground. Filter capacitors C1 and C3 are respectively connected between the DC voltages Vgs and Vdss and ground.

The drain circuit includes an output matching circuit which includes transmission lines TL1, TL2, TL3, and TL4 which are advantageously configured to simultaneously provide several matching conditions. First, a width of TL1, TL2, and TL4 is selected to provide a conjugate match for the drain impedance for good power transfer. Second, a length of TL1 and TL2 is selected to present a high impedance for third harmonics of the fundamental frequency. Third, a length of TL3 is selected to present a low impedance for even harmonics of the fundamental frequency.

An input matching circuit includes transmission lines TL5 through TL7. A tuning circuit includes transmission lines TL8 through TL10 and the capacitor C4. A bias circuit includes the resistor R1, the filter caps C1 and C3, and their respective DC connections to the gate G and drain D. Further details regarding suitable tuning and bias circuits may be had by reference to the '940 and '161 publications.

The feedback circuit includes the capacitor Cf1 which couples a signal from the transmission line TL4 to the feedback transmission line TL11. The capacitor Cf2 is selected to adjust the phase of the feedback signal. The capacitor Cf1 and Cf2 also perform a voltage division function which reduces the feedback voltage to safe operating levels for the gate G of the transistor Q1.

With reference to FIGS. 4–5, a suitable printed circuit board layout and assembly detail is shown for an oscillator according to the first example. An example methodology in accordance with the present invention for providing all of the necessary circuit conditions for a high frequency, high efficiency power oscillator is as follows:

The transmission line TL2 is an open stub. The effective electrical length of the lines TL1 and TL2 is selected to be:

$$L_{TL1}=L_{TL2}=\lambda_3/4 \qquad \text{Eq. (1)}$$

where $\lambda_3$ is the wavelength of third harmonic of the fundamental frequency. The effective electrical length of each of TL1 and TL2 is approximately equal to one twelfth (1/12th) of the wavelength of the fundamental frequency. For micro-strip transmission lines, the precise length may differ from the ideal value due to frequency dependent variations in the effective dielectric constant of the substrate material. Advantageously, the matching condition for the third harmonic is broken up into two quarter wavelength stubs. At the junction of the lines TL1 and TL2, the third harmonic is presented with a low impedance due to the quarter wavelength length of TL2. Accordingly, little third harmonic content is passed on the output or to the feedback stub TL4. However, TL1 and TL2 together form the desired resonant structure for presenting a high impedance for the third harmonic and reflecting the signal back on the drain.

If needed, the transmission line TL3 is a short stub at the second harmonic of the fundamental frequency. The effective electrical length of the line TL3 is selected to be:

$$L_{TL3}=\lambda_2/4 \qquad \text{Eq. (2)}$$

where $\lambda_2$ is the wavelength of the second harmonic of the fundamental frequency. The effective electrical length of TL3 is approximately equal to one eighth (1/8th) of the wavelength of the fundamental frequency. The actual length of TL3 may be reduced by utilizing a capacitor (e.g. C2) to ground.

The widths of the transmission lines TL1-TL4, the length of the transmission line TL4, and the match circuit are selected to provide a conjugate match load for the drain impedance. The selected width primarily effects the impedance of the line, with wider lines providing lower impedance. However, the width also affects the effective dielectric constant and consequently the guide wavelength $\lambda_g$. Accordingly, a trade off may occur between a desired width for the lines TL1, TL2, and TL4 and the appropriate lengths to provide the desired circuit conditions from #1 above. The match circuit includes transmission lines and components (e.g. TL12, TL13, C5, C6 in FIG. 5) to provide an impedance transformation from the nominal load (e.g. 50 ohms) to the junction of TL1, TL2, and TL4 to provide a matched drain impedance to the nominal load impedance at the fundamental frequency over some bandwidth.

An appropriate length for transmission line TL11 and suitable values an positions for the capacitors Cf1 and Cf2 are selected to provide appropriate feedback gain and phase shift to initiate and sustain oscillation at the fundamental frequency. Details regarding the selection of appropriate values may be had with reference to '940 publication. The position of Cf1 along TL1 or TL4 may be adjusted to adjust the frequency and also to adjust the amount of feedback signal coupled through Cf1.

SECOND EXAMPLE

Figure 6:
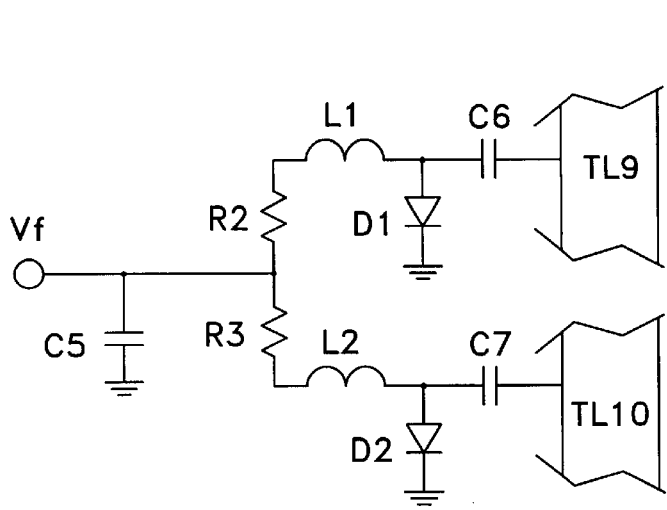
FIG. 6 is a schematic diagram of a tuning circuit suitable for use with the oscillator of the present invention.
Figure 7:
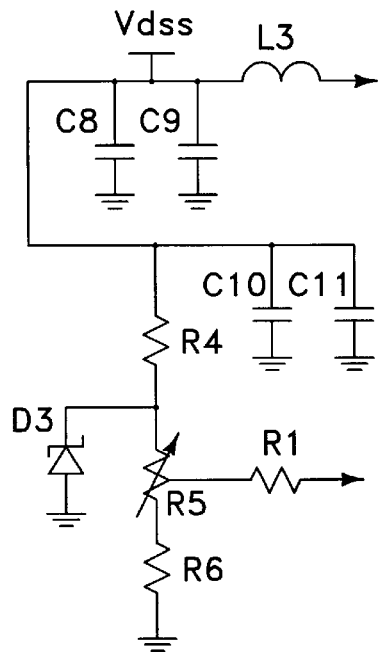
FIG. 7 is a schematic diagram of a bias circuit suitable for use with the present invention.

With reference to FIGS. 6–9, a second example of an oscillator includes an electronically variable tuning circuit and an alternative bias circuit arrangement. The tuning circuit shown in FIG. 6 is configured to provide a variable damping coefficient on the feedback signal to the transistor, thereby influencing the oscillator operating frequency. By adjusting the voltage Vf, the amount of influence the tuning circuit has on the oscillator frequency is likewise varied. In the present example, the voltage Vf determines the amount of current flowing through the PIN diodes and accordingly changes the PIN diodes conductivity. The conductivity of the PIN diodes affects the impedance of C6, D1 and C7, D2, respectively connected between TL9/TL10 and ground, and consequently changes the operating frequency of the oscillator. The voltage Vf may be provided by an external control circuit, as further described in the '940 and '161 publications. The PIN diodes in the tuning circuit may be connected to a grounded heatsink post as described in the '161 publication. The bias circuit shown in FIG. 7 is configured to receive a single DC voltage Vdss which is provided to the drain through an RF choke circuit and which is also divided through a resistor network to provide a suitable voltage level for the gate bias voltage.

Figure 8:
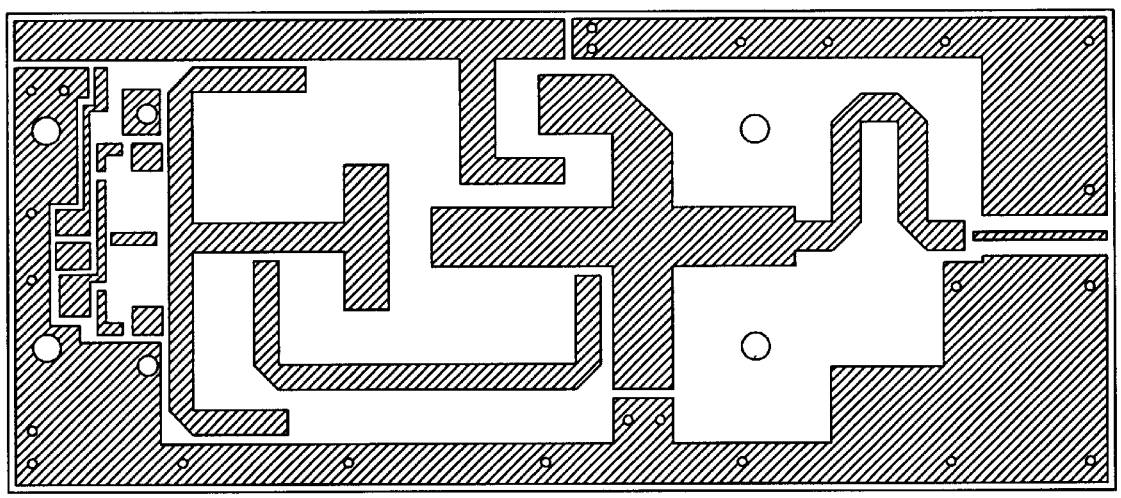
FIG. 8 is a printed circuit board diagram for a second example of an oscillator according to the present invention.
Figure 9:
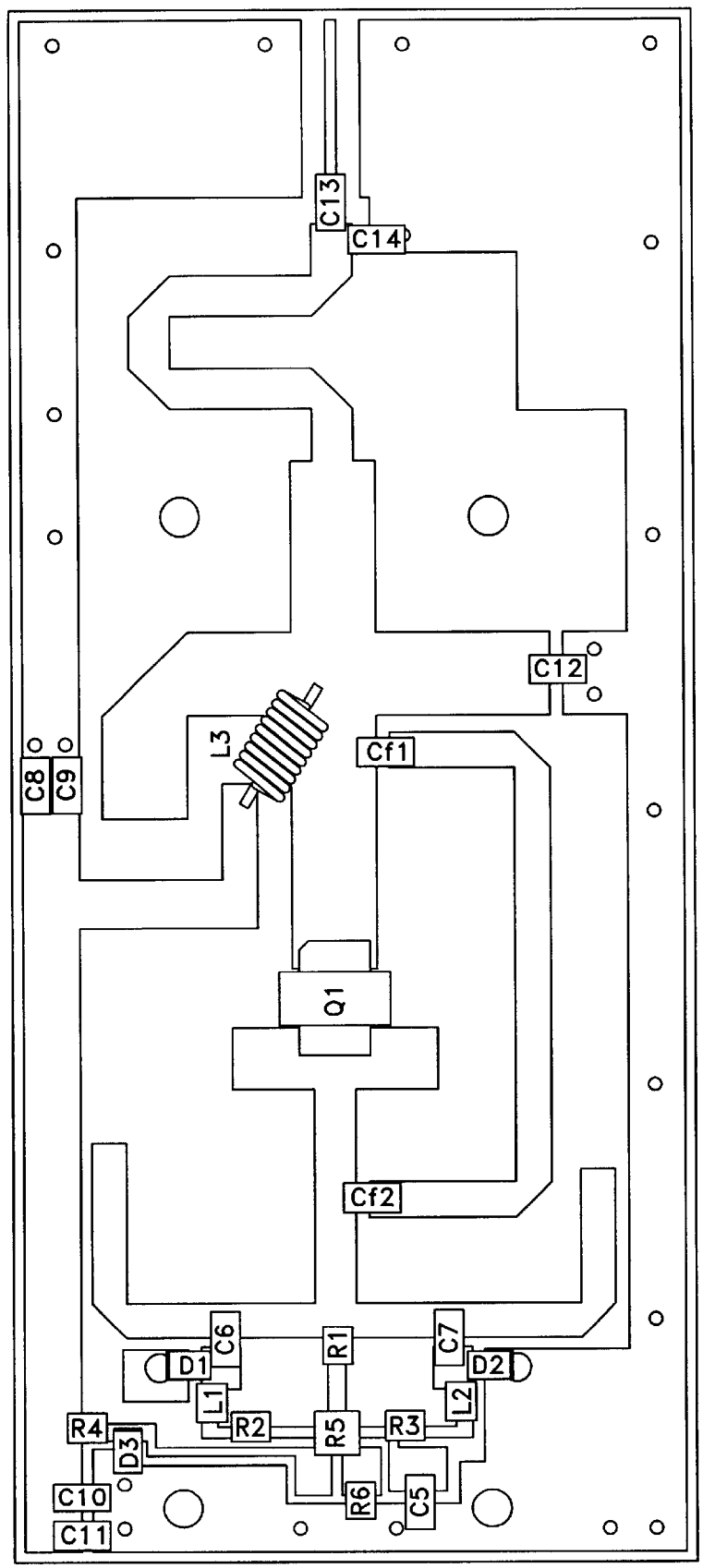
FIG. 9 is an assembly level diagram of the second example.

In practice, depending on the particular circuit configuration, an oscillator circuit may not produce significant levels of second harmonics. In such a configuration, a shorted quarter wavelength line (e.g. the transmission line TL3) may not be needed and simple RF choke may be utilized. With reference to FIGS. 8–9, a printed circuit board layout and assembly detail is shown which incorporates the above-described tuning and bias circuits and omits the shunt for even harmonics (TL3). Board dimensions for a fundamental frequency of approximately 430 MHz are approximately 78 mm by 176 mm and the board material has a nominal dielectric constant of 3. Suitable component values are indicated in Table 1.

| Reference | Description |
| --- | --- |
| Q1 | RF Power FET, Spectrian URF1080 |
| Cf1 | 0.4 to 2.4 pF variable capacitor |
| Cf2 | 33 pF capacitor |
| C5 | 470 pF capacitor |
| C6 | 2.7 pF capacitor |
| C7 | 2.7 pF capacitor |
| C8 | 4700 pF capacitor |
| C9 | 1000 pF capacitor |
| C10 | 4700 pF capacitor |
| C11 | 4.7 uF capacitor |
| C12 | 9.1 pF capacitor |
| C13 | 130 pF capacitor |
| C14 | 3.9 pF capacitor |
| D1 | PIN diode |
| D2 | PIN diode |
| L1 | 330 nH inductor |
| L2 | 330 nH inductor |
| L3 | 18 AWG, 8 turn hand wound inductor |
| R1 | 100K ohm resistor |
| R2 | 5.1K ohm resistor |
| R3 | 5.1K ohm resistor |
| R4 | 3.3K ohm resistor |
| R5 | 1K ohm variable resistor |
| R6 | 3.3K ohm resistor |

Figure 10:
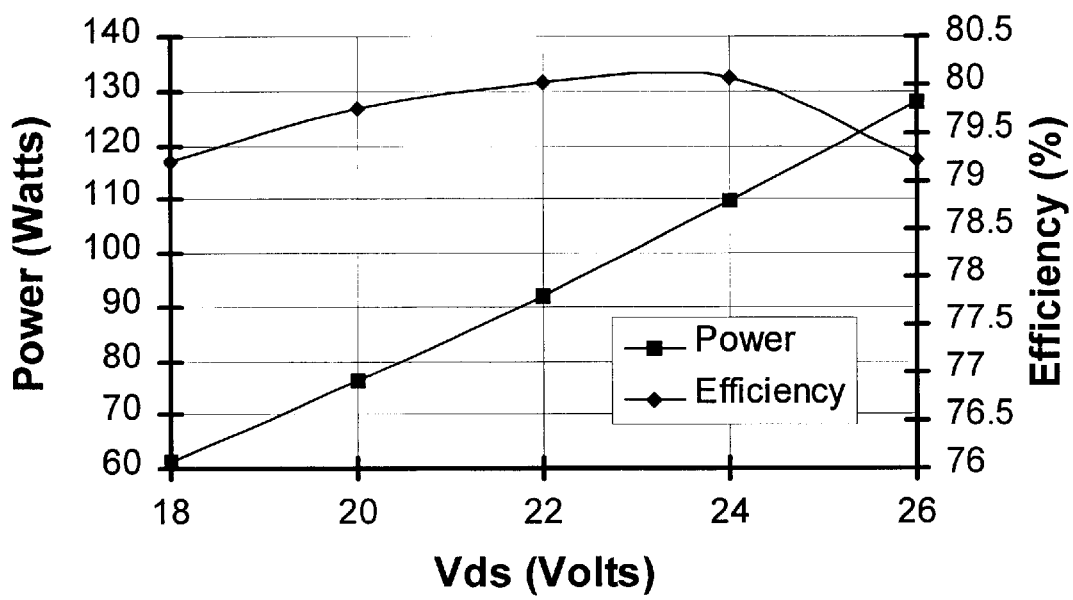
FIG. 10 is a combined graph of power versus drain voltage and efficiency versus drain voltage for one configuration of the second example.
Figure 11:
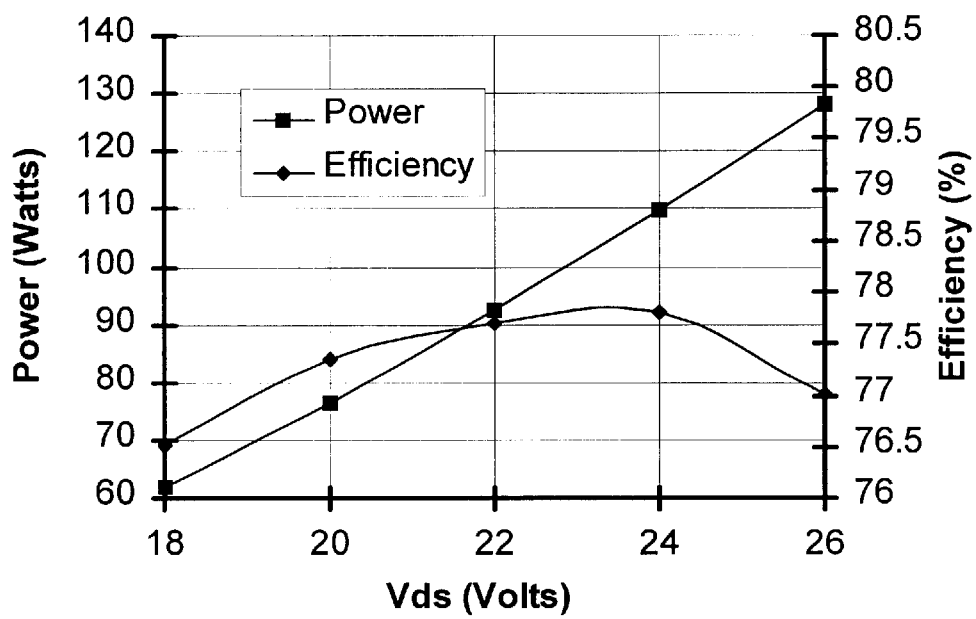
FIG. 11 is a combined graph of power versus drain voltage and efficiency versus drain voltage for another configuration of the second example.

With reference to FIGS. 10–11, exemplary performance data are shown for the second example. The second example is configured to provide RF power at about 430 MHz. For the data graphed in FIG. 10, the electronically controlled tuning circuit is not connected and a single capacitor provides the tuned oscillating frequency. Efficiency of greater than 80% is achieved at RF power levels between about 85 and 112 Watts. Efficiency above 79% is achieved over the entire power range illustrated between about 60 and 130 RF Watts. The data graphed in FIG. 11 includes the electronically variable tuning circuit. The tuning circuit causes a small loss in efficiency. However, efficiency is still quite good over the range of powers illustrated.

THIRD EXAMPLE

Figure 12:
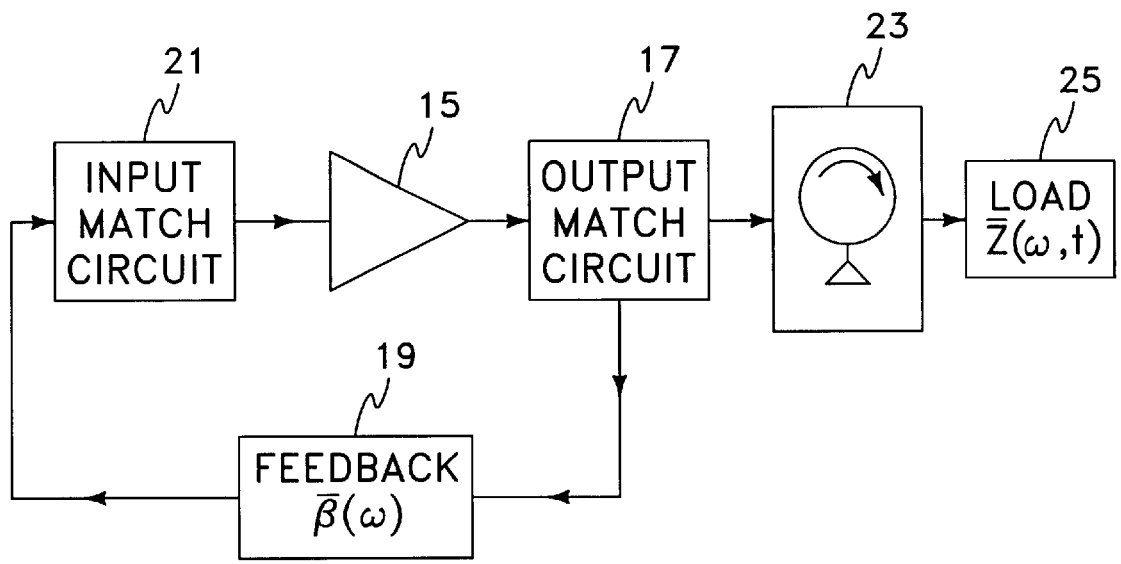
FIG. 12 is a block diagram of a conventional RF system.

A conventional oscillator system is illustrated in connection with FIG. 12. An active device 15 provides an output to an output match circuit 17. A feedback circuit 19 provides a feedback signal to an input match circuit 21 connected to an input of the active device 15. The output signal is passed through an isolator or circulator 23 to a load 25. The isolator 23 protects the oscillator circuit from high reflections by redirecting such reflections to a dummy load. The isolator 23 passes output power through itself and absorbs part of that power, thereby decreasing system efficiency. Also, isolators typically operate in a narrow frequency band, are relatively large circuit components and are relatively expensive.

As noted above, the oscillator circuits of the present invention preferably incorporate the feedback protection principles discussed in the aforementioned '940 and '161 publications. Moreover, many of the oscillator circuits described in those references have stable operation without the use of isolators or circulators. However, reliability of the oscillator may be further improved in with a protection circuit connected to the input of the active device.

Figure 13:
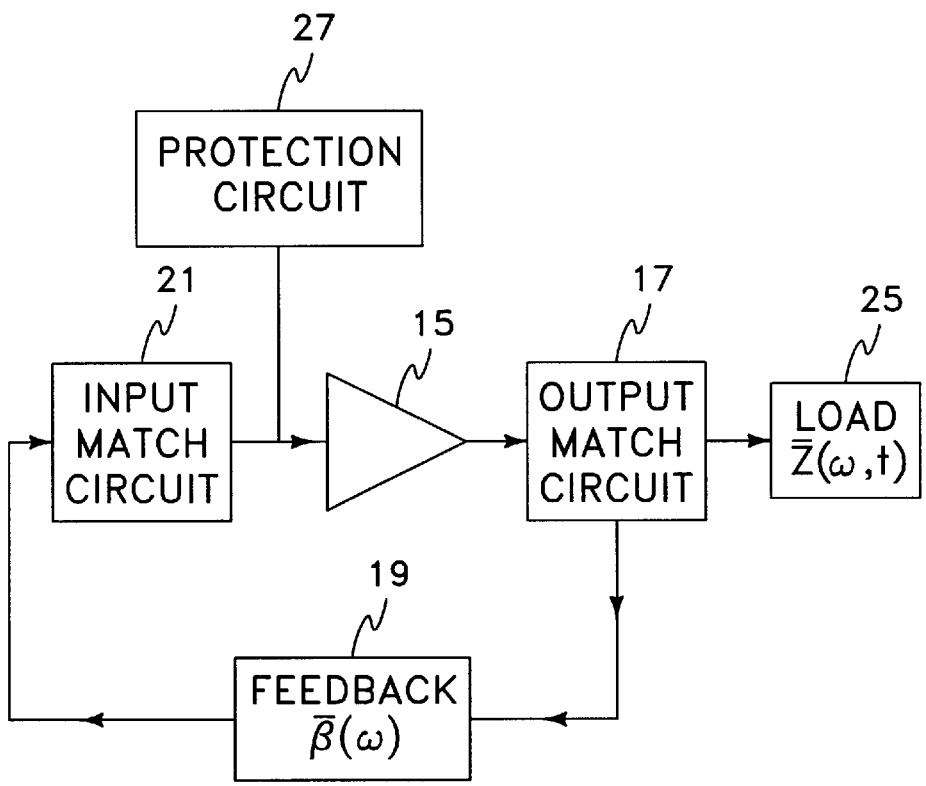
FIG. 13 is a block diagram of an RF system including a protection circuit in accordance with a present aspect of the invention.

With reference to FIG. 13, an oscillator according to a present aspect of the invention includes an active device 15 which provides an output to an output match circuit 17, a feedback circuit 19 connected between the output match circuit 17 and an input match circuit 21, where the feedback circuit 19 provides a feedback signal from the output of the active device to an input of the active device 15. The output signal is connected directly to a load 25. The oscillator further includes a protection circuit 27 connected to an input of the active device 15 and configured to protect the active device 15 from destructive feedback.

Figure 14:
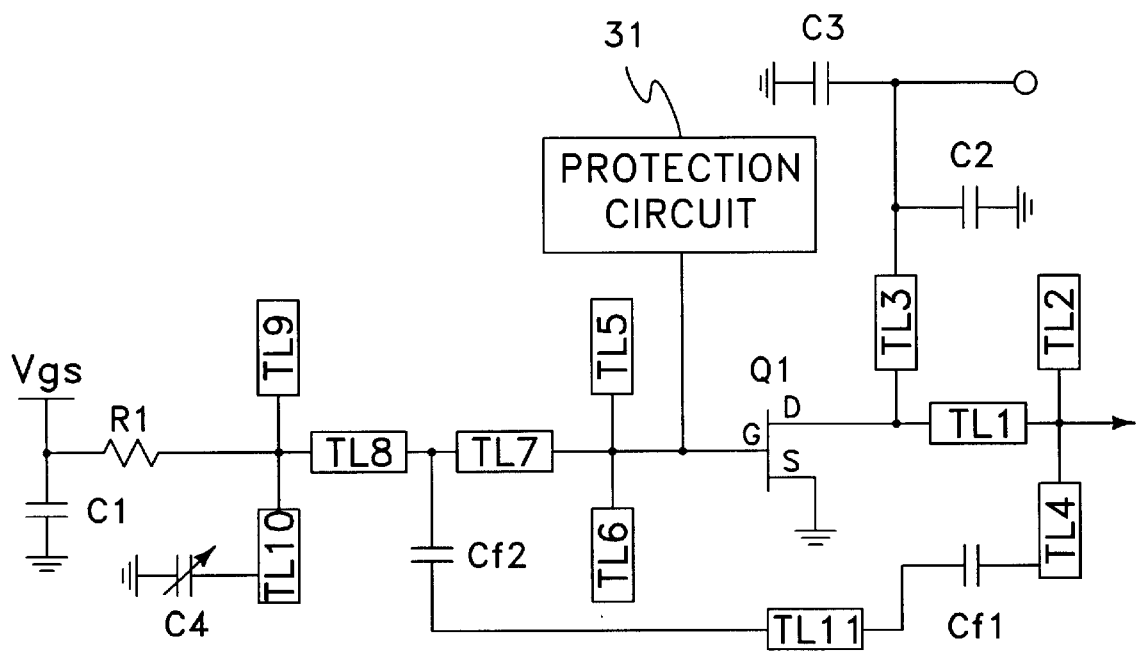
FIG. 14 is a schematic diagram of a third example of an oscillator according to the present invention, including a protection circuit.

With reference to FIG. 14, an oscillator circuit is identical to the circuit described above in connection with FIG. 3, with the addition of a protection circuit 31 connected to the gate of the transistor Q1.

Figure 15:
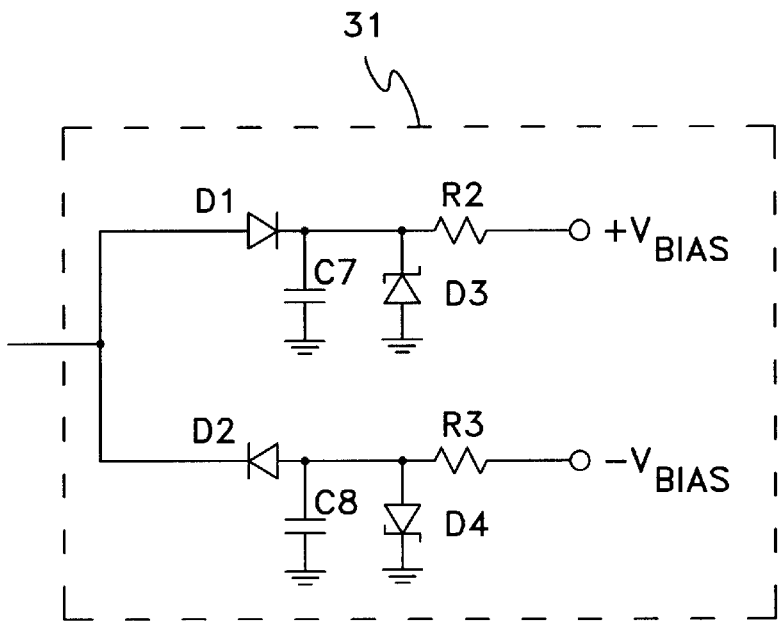
FIG. 15 is a schematic diagram of a protection circuit in accordance with the present aspect of the invention.

A preferred schematic diagram of the protection circuit 31 is shown in FIG. 15. The protection circuit includes two high power P-I-N diodes, two capacitors, two Zener diodes, and biasing components. A suitable first bias voltage +Vbias is connected to one end of a resistor R2. The other end of R2 is connected to a cathode end of a PIN diode D1, a cathode end of a Zener diode D3, and one terminal of a capacitor C7. The other end of the capacitor C7 and the anode of the Zener diode D3 are each connected to ground. A suitable second bias voltage −Vbias is connected to one end of a resistor R3. The other end of R3 is connected to an anode end of a PIN diode D2, an anode end of a Zener diode D4, and one terminal of a capacitor C8. The other end of the capacitor C8 and the cathode of the Zener diode D4 are each connected to ground. The anode end of the PIN diode D1 is connected to the cathode end of the PIN diode D2. In the oscillator circuit the junction of the PIN diodes D1 and D2 is connected to the input of the active device.

Further details of the operation of the protection circuit may be had with reference to co-pending application no. PCT/US01/_____, entitled VOLTAGE CLAMPING CIRCUIT, filed concurrently on an even date herewith.

Figure 16:
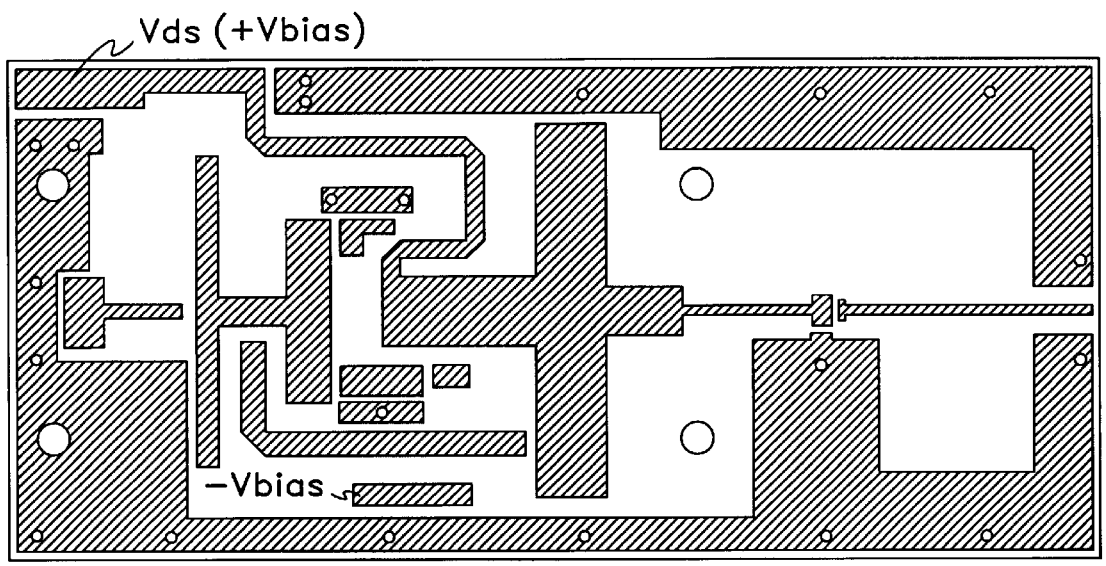
FIG. 16 is a printed circuit board diagram for the third example.
Figure 17:
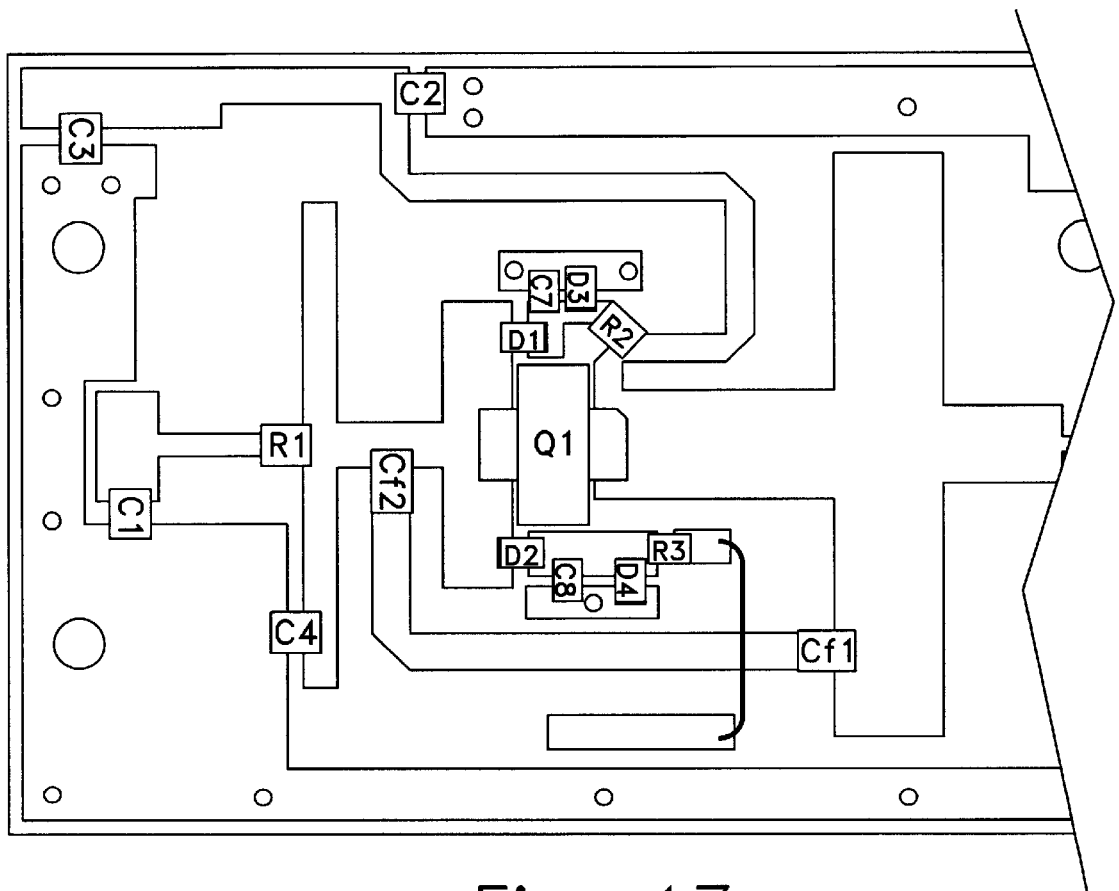
FIG. 17 is an enlarged, fragmented assembly level diagram of the third example.

With reference to FIGS. 16–17, an oscillator printed circuit board layout and assembly is substantially identical to the first example, with the addition of components and connections for implementing the protection circuit from FIG. 15. The DC drain voltage Vds is used as the first bias voltage +Vbias. A separate DC voltage is provided for the second bias voltage −Vbias. Suitable component values are as follows:

| Reference | Description |
| --- | --- |
| C7 | 470 pF capacitor |
| C8 | 470 pF capacitor |
| D1 | PIN diode |
| D2 | PIN diode |
| D3 | 13 V Zener diode |
| D4 | 6 V Zener diode |
| R2 | 3.3K ohm resistor |
| R3 | 3.3K ohm resistor |

FOURTH EXAMPLE

Figure 18:
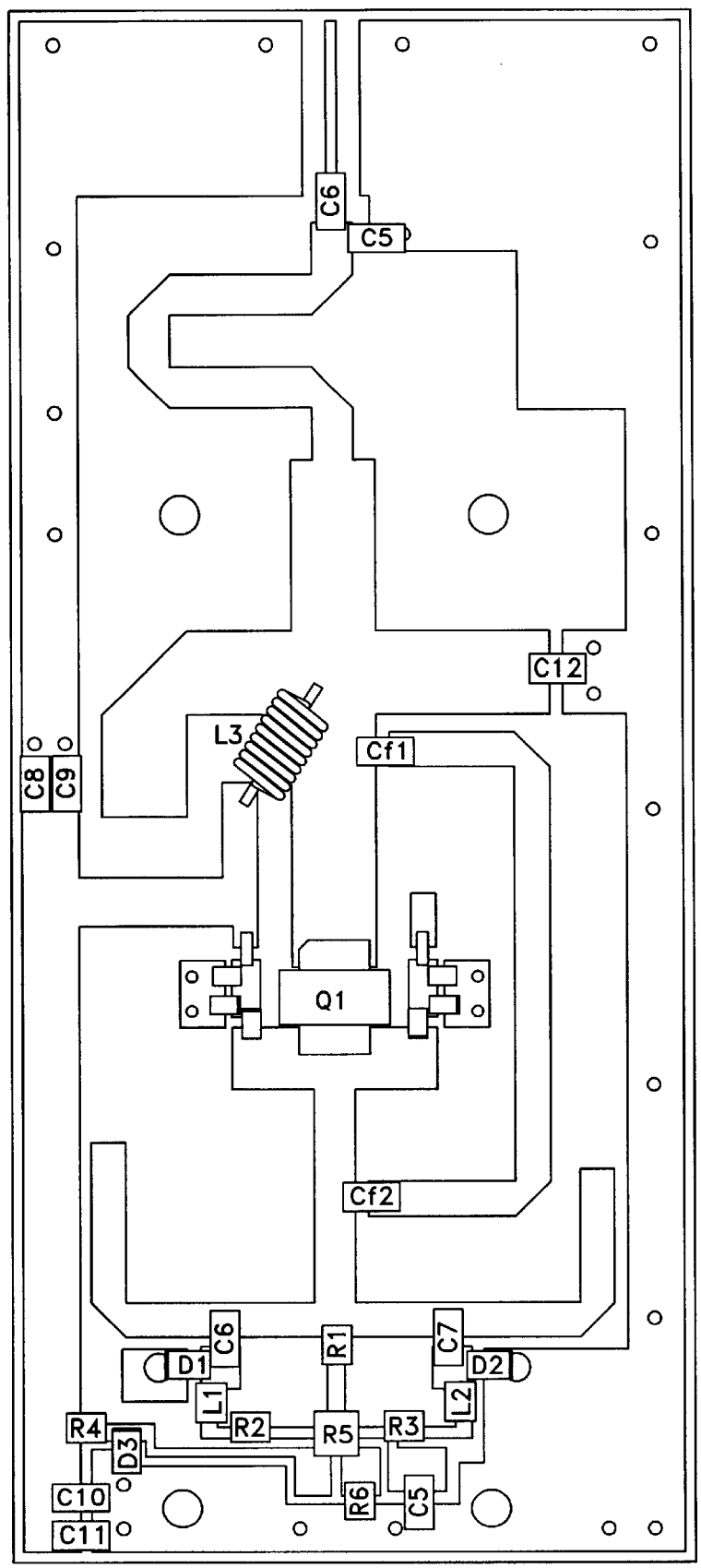
FIG. 18 is an assembly level diagram of a fourth example of an oscillator including the protection circuit.
Figure 19:
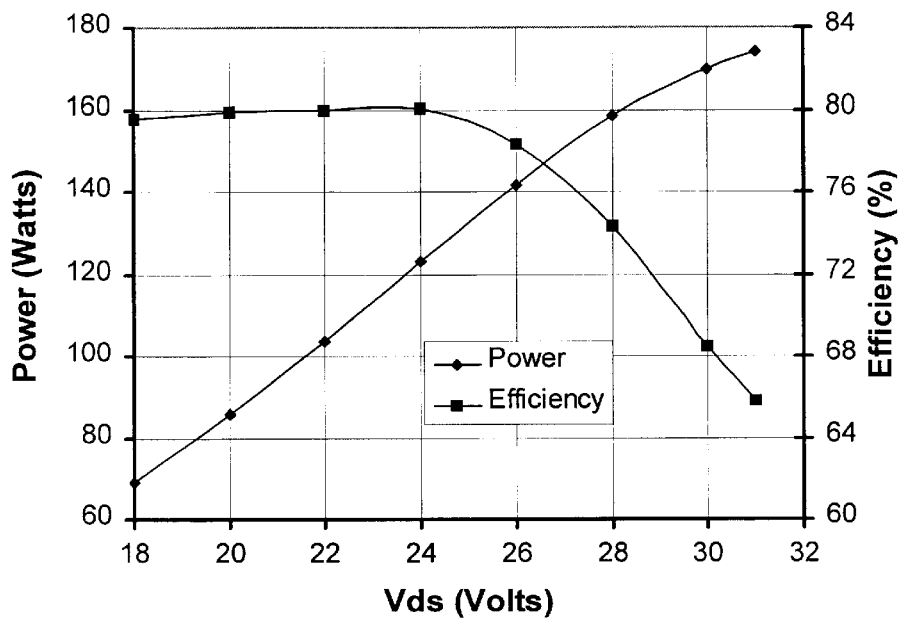
FIG. 19 is a combined graph of power versus drain voltage and efficiency versus drain voltage for the fourth example.
Figure 20:
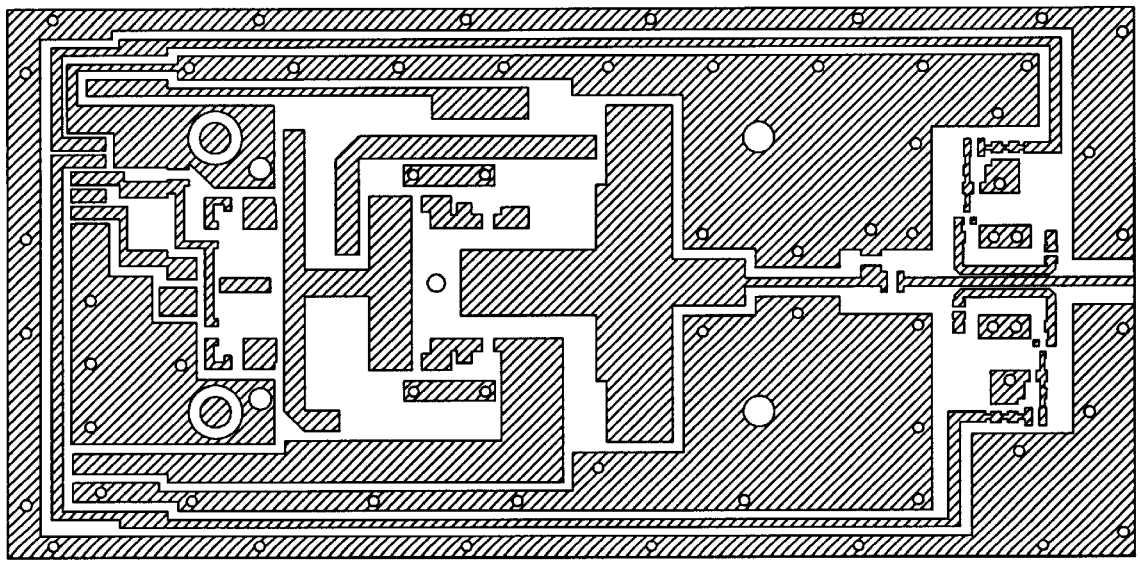
FIG. 20 is a printed circuit board layout for a fifth example of an oscillator according to the present invention, including an optional directional coupler circuit.
Figure 21:
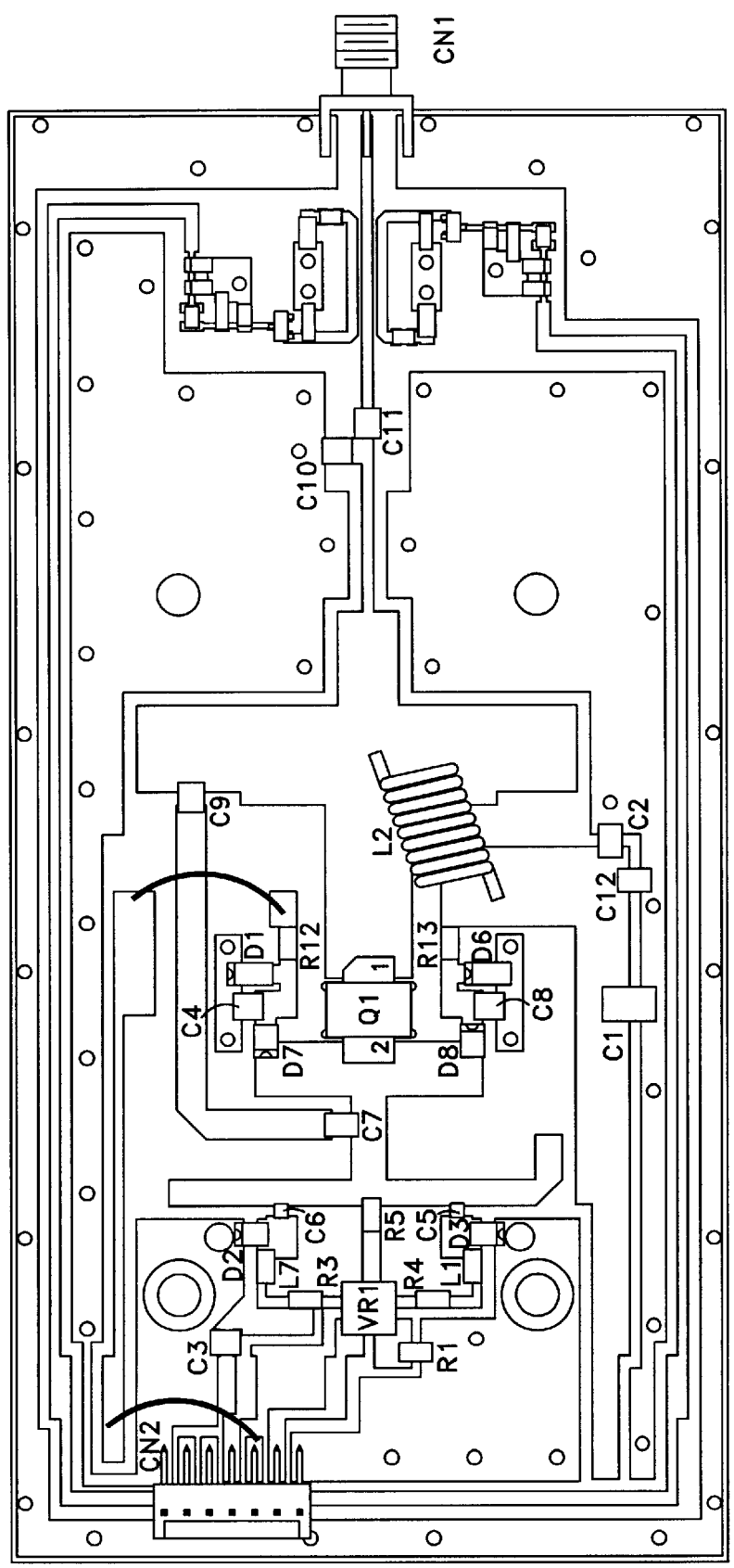
FIG. 21 is an assembly level diagram of the fifth example.

With reference to FIGS. 18–19, the fourth example is generally similar to the second example, with the addition of the above-described protection circuit. For an operating frequency of 430 MHz, as can be seen in FIG. 19, the novel oscillator circuit provides efficiency of up to 80% at an output power of 125 W, without the variable tuning circuit. Power of about 160 RF Watts is achieved at about 74% efficiency. Power in excess of 170 RF Watts is achieved at better than 65% efficiency. The protection circuit, together with the protection provided in the feedback circuit, protects the oscillator transistor when the load impedance changes from short circuit to a nominal load (e.g. 50 Ohm) with no circulator or isolator.

FIFTH EXAMPLE

With reference to FIGS. 20–23, a power oscillator according to the present invention is configured for operation in the region of 700 MHz. The printed circuit board includes an optional integral direction coupler as described in the '161 publication for providing signals representative of forward and reflected power to an external RF control circuit. Board dimensions are approximately 80.24 mm by 164 mm and the board material has a nominal dielectric constant of 3. Suitable component values for oscillator are as follows:

| Reference | Description |
|---|---|
| Q1 | RF Power FET, Spectrian S1F90 |
| C1 | 4.7 uF capacitor |
| C2 | 4700 pF capacitor |
| C3 | 470 pF capacitor |
| C4 | 470 pF capacitor |
| C5 | 2.7 pF capacitor |
| C6 | 2.7 pF capacitor |
| C7 | 22 pF capacitor |
| C8 | 470 pF capacitor |
| C9 | 1.5 pF capacitor |
| C10 | 2 pF capacitor |
| C11 | 130 pF capacitor |
| C12 | 1000 pF capacitor |
| D1 | Zener diode, 6.2 V, 1.5 W (1SMA5920BT3) |
| D2 | PIN diode (M/A-COM MA4P7002F) |
| D3 | PIN diode (M/A-COM MA4P7002F) |
| D6 | Zener diode, 12 V, 1.5 W (1SMA5929BT3) |
| D7 | PIN diode (M/A-COM MA4P7002F) |
| D8 | PIN diode (M/A-COM MA4P7002F) |
| L1 | 330 nH inductor |
| L2 | 18 AWG, 9 turn hand wound inductor |
| L7 | 330 nH inductor |
| R1 | 3.3K ohm resistor |
| R3 | 5.1K ohm resistor |
| R4 | 5.1K ohm resistor |
| R5 | 100K ohm resistor |
| R12 | 3.3K ohm resistor |
| R13 | 3.3K ohm resistor |
| VR1 | 1K ohm variable resistor (Spectrol 004G102TR) |

Figure 22:
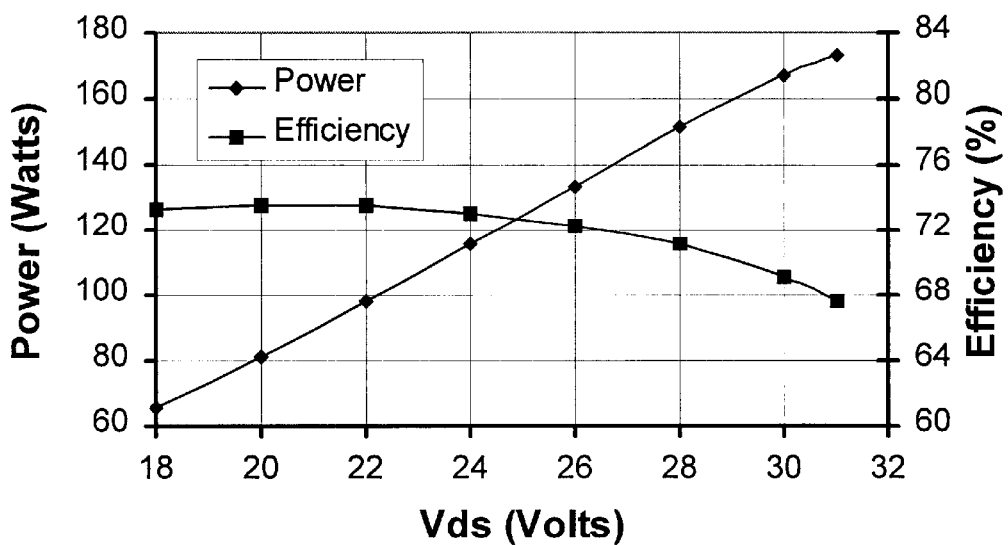
FIG. 22 is a combined graph of power versus drain voltage and efficiency versus drain voltage for the fifth example.
Figure 23:
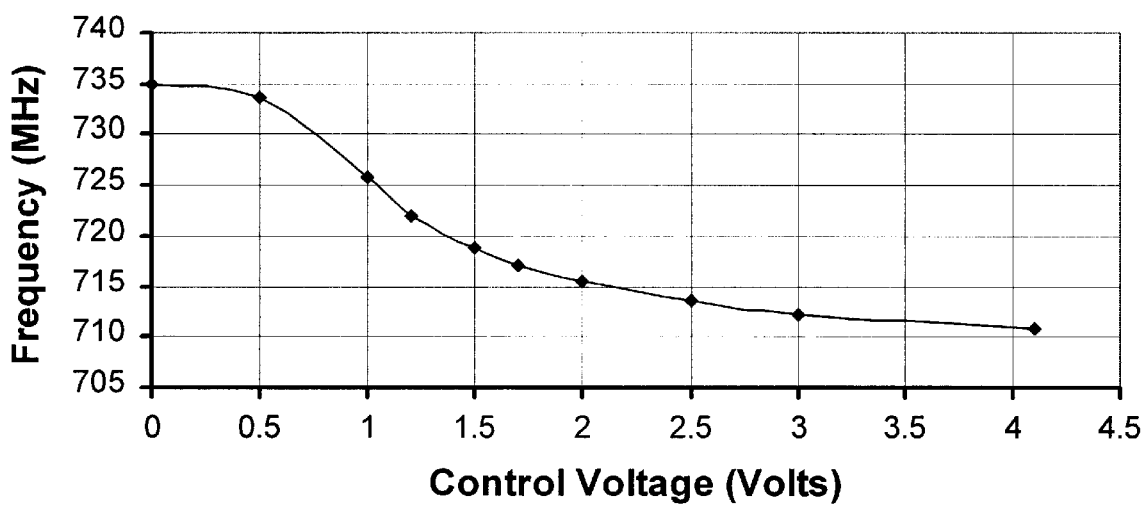
FIG. 23 is a graph of frequency of operation versus control voltage for the fifth example.

Performance data for the fifth example is shown in FIG. 22, without the variable tuning circuit. With the variable tuning circuit, efficiency is slightly lower. As is shown in FIG. 23, the oscillator can be tuned over a range of about 711 MHz to about 735 MHz by adjusting the control voltage on the PIN diodes D2, D3 over a range of 0 to 4.1 volts.

While the invention has been described in connection with what is presently considered to be the preferred examples, it is to be understood that the invention is not limited to the disclosed examples, but on the contrary, is intended to cover various modifications and equivalent arrangements included within the spirit and scope of the inventions.

What is claimed is:

1. A high power solid state power RF oscillator, comprising:

a power FET having a gate, a drain, and a source, wherein the source is RF grounded and suitable voltages are respectively applied to the drain and gate to place the transistor in a conducting condition;

a drain circuit connected to the drain of the power FET; and a feedback circuit connected between the drain circuit and the gate, wherein the feedback circuit is adapted to provide suitable positive feedback to initiate and sustain an oscillating condition with a fundamental frequency being greater than 300 MHz and with an RF power output in excess of 50 watts;

characterized in that the drain circuit comprises transmission lines having widths which provide a conjugate match for the drain at a fundamental frequency and lengths which provide a high impedance for odd harmonics of the fundamental frequency.

2. The oscillator as recited in claim 1, wherein the drain circuit further includes a transmission line having a length which provides a low impedance for even harmonics of the fundamental frequency.

3. A high power solid state power RF oscillator, comprising:

a power FET having a gate, a drain, and a source, wherein the source is RF grounded and suitable voltages are respectively applied to the drain and gate to place the transistor in a conducting condition;

a drain circuit connected to the drain of the power FET; and a feedback circuit connected between the drain circuit and the gate, wherein the feedback circuit is adapted to provide suitable positive feedback to initiate and sustain an oscillating condition with a fundamental frequency being greater than 300 MHz and with an RF power output in excess of 50 watts;

characterized in that the drain circuit comprises a first transmission line connected at a first end to the drain and at a second end to an output matching circuit, and a second transmission line which is an open stub connected to the second end of the first transmission line, wherein the first transmission line and second transmission lines each have a width which provides a conjugate match for the drain at a fundamental frequency and an effective electrical length of about one twelfth of a wavelength of the fundamental frequency.

4. The oscillator as recited in claim 3, wherein the drain circuit further includes a third transmission line connected at one end to the drain and having an effective electrical length of one eighth of the wavelength of the fundamental frequency.

* * * * *